United States Patent [19]
Yoshida

[11] Patent Number: 4,880,979
[45] Date of Patent: Nov. 14, 1989

[54] INFRARED RAY DETECTOR
[75] Inventor: Yasuaki Yoshida, Itami, Japan
[73] Assignee: Mitsubishi Denki Kabushiki Kaisha, Japan
[21] Appl. No.: 158,735
[22] Filed: Feb. 23, 1988
[30] Foreign Application Priority Data
  Feb. 27, 1987 [JP] Japan .................................. 62-45635
[51] Int. Cl.[4] .............................................. G01J 5/20
[52] U.S. Cl. .................... 250/338.4; 250/370.15; 250/352
[58] Field of Search ................ 250/352, 338.4, 370.01, 250/370.15; 62/514 R

[56] References Cited
U.S. PATENT DOCUMENTS 4,412,427 11/1983 Horn et al. ............................ 62/298
4,540,115 9/1985 Hawrylo ............................. 228/123

FOREIGN PATENT DOCUMENTS 0102262  3/1984 European Pat. Off. .
57-24580  2/1982 Japan .
57-62569  4/1982 Japan .
57-73637  5/1982 Japan .
57-157123 9/1982 Japan .
1278444  6/1972 United Kingdom .
1310766  3/1973 United Kingdom .
2110469  8/1982 United Kingdom .
2148015  5/1985 United Kingdom .
2178595  2/1987 United Kingdom .
2186741  8/1987 United Kingdom .

OTHER PUBLICATIONS

Chiari et al., "Detectors for Thermal Imaging", vol. 4 No. 4, Electronic Components and Applications, Aug. 1982.

Primary Examiner—Janice A. Howell
Assistant Examiner—Richard Hanig
Attorney, Agent, or Firm—Leydig, Voit & Mayer

[57] ABSTRACT

An infrared ray detector includes, an infrared ray detection element farbicated in a water which is produced by growing a semiconductor responsive to infrared ray on a high resistance substrate, a metal submount provided with two lead terminals insulated from each other, to which submount the infrared ray detection element is mechanically fixed, an adiabatic vacuum vessel for containing and cooling the infrared ray detection element, to which vessel the metal submount is mechanically fixed, the infrared ray detection element and the metal submount. The metal submount and the adiabatic vacuum vessel are respectively adhered to each other by solder.

10 Claims, 4 Drawing Sheets

INFRARED RAY DETECTOR

FIELD OF THE INVENTION

The present invention relates to an infrared ray detector, and more particularly, to a detector of high efficiency that may be easily mass produced.

BACKGROUND ART

FIGS. 6 and 7 show a perspective view and a side view of a structure of a prior art infrared ray detection element, and FIG. 8 shows a structure of a prior art infrared ray detector.

In these figures, the reference numeral 2 designates a HgCdTe crystal, the numeral 3 designates an electrode, the numeral 4 designates a light receiving surface, and the reference numeral 1 designates an infrared ray detection element. The reference numeral 5 designates a supporting plate for supporting the infrared ray detection element 1, comprising an electrically insulating material such as sapphire, and the numeral 6 designates an adhesive. The reference numeral 7 designates an adiabatic vacuum vessel (hereinafter referred to as a, "dewar"). The reference numeral 8 designates glass constituting a surrounding wall of the vessel 7, the numeral 9 designates a fernico series alloy on a portion of which the infrared ray detection element 1 is mounted. The reference numeral 10 designates an infrared ray transparent window comprising, for example, ZnS for introducing infrared ray into the vessel 7,. The reference numeral 11 designates a lead wire one end of which is connected to the electrode 3 of the infrared ray detection element 1, and the other end thereof is connected to an electrode lead 27. The reference numeral 12 designates a hollow section for containing a cooling device or medium provided at the center of the dewar 7, and the reference numeral 13 designates an infrared ray detector as described.

The HgCdTe crystal 2 is a compound semiconductor having a small band gap and is widely used as an infrared ray detection element material for detecting infrared rays having wavelengths in the range of 3 to 5 $\mu$m or 10 $\mu$m.

The HgCdTe crystal 2 is attached to a supporting plate 5 by an adhesive 6, and thereafter the crystal is reduced to a thickness of about 10 $\mu$m by grinding or etching,. A material such as indium is vapor plated on the surface, other than the light receiving surface 4, to produce an electrode 3. An anodic oxide film, a protection film such as ZnS film, and a reflection reducing coating or the like are provided on the light receiving surface 4. An infrared ray detection element 1 is fabricated in this way.

The infrared ray detection element 1 is fixed onto the fernico series alloy 9 of the dewar 7 i.e., to a side of the supporting plate 5 with the adhesive 6. Thereafter the air inside of the dewar 7 is exhausted, thereby producing an infrared ray detector 13. The infrared ray detection element 1 is contained in the dewar 7 to enable cooling of the infrared ray detection element 1 down to below 200° K. This cooling of the infrared ray detection element 1 is produced by a cooling device or medium inserted in the hollow section 12 at the center of the dewar 7. A Joule-Thomson cooler, Stirling cycle cooler, Peltier element cooler, or liquid nitrogen may be used as the cooler.

In an infrared ray detector used for detecting a guided missile, the time period from the start of cooling to the start of operation (hereinafter referred to as "cool down time") is required to be short. Actually, a Joule-Thomson cooler is usually used and the cool down time is required to be below several seconds.

Furthermore, although the dewar 7 may be used by exhausting the air therein with a vacuum pump connected thereto, when miniaturization and lightening of the infrared ray detector 13 is required, the sealing of the dewar 7 should be carried out after the inside air is exhausted. At this sealing, air exhaustion is conducted with heating for several tens of hours to maintain the inside of the dewar 7 under vacuum for a long time.

Since it takes a long time for the sealing, it is generally required that the sealing takes place after the evaluation and selection of the infrared ray detection element 1 to aid mass production.

In the prior art infrared ray detector 13, since the thermal conductivities of both the adhesive 6 and the supporting plate 5 are low and the heat capacities thereof are large, the cool down time is disadvantageously long i.e. from 10 several seconds to several minutes.

Furthermore, because it is required to fix the infrared ray detection element 1 to the dewar with the adhesive 6 and connect the wire thereof directly to the electrode 3 in order to evaluate the element characteristics of the infrared ray detection element 1, it is impossible to evaluate and select the infrared ray detection element 1 before sealing the dewar 7. This resulted in poor mass producibility.

An example of another prior art infrared ray detector, is disclosed in Japanese Laid-open Patent Publication No. 57-73637. In this infrared ray detector, an infrared ray detection element may be detachably, mounted on a base plate for provisional mounting of an infrared ray detection element in a dewar.

Another prior art infrared ray detector is disclosed in Japanese Laid-Open Patent Publication No. 57-62569. In this detector, an infrared ray detection element is fixed to a supporting plate having a pin electrode, and thus an infrared detection element may be provisionally mounted in to a dewar.

Another prior art infrared ray detector is described in Japanese Laid-open Patent Publication No. 57-24580. In this detector, an infrared ray detection element is obtained by producing a $Hg_{1-x}Cd_xTe$ crystal layer on a CdTe substrate by epitaxial growth.

SUMMARY OF THE INVENTION

An object of the present invention is to provide an infrared ray detector capable with a reduced cool down time and that may be readily mass produced.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a plurality of infrared ray detection elements are obtained from a wafer which is produced by growing a semiconductor layer responsive to infrared rays on a high resistance substrate, an infrared ray detection element is mechanically fixed to a metal submount having I/O lead terminals, the metal submount is mechanically fixed to an adiabatic vacuum vessel for cooling the infrared ray detection element, the infrared ray detection element and the metal submount, and the metal submount and the adiabatic vacuum vessel are respectively adhered to each other by solder. This arrangement enables reduction of the cool down time and enhances mass production.

DETAILED DESCRIPTION OF THE PREFERRED EMBODIMENTS

An embodiment of the present invention will be described with reference to FIGS. 1 to 5.

Figure 6:
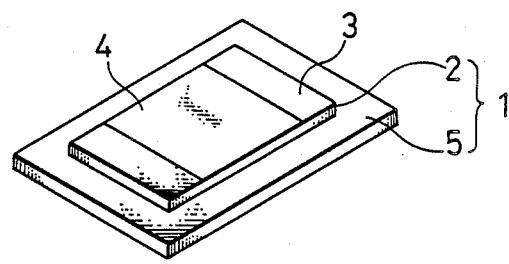
FIGS. 6 and 7 are a perspective view and a side view showing a prior art infrared ray detection element, respectively.
Figure 7:
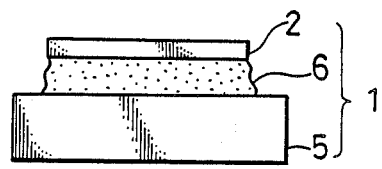
Figure 8:
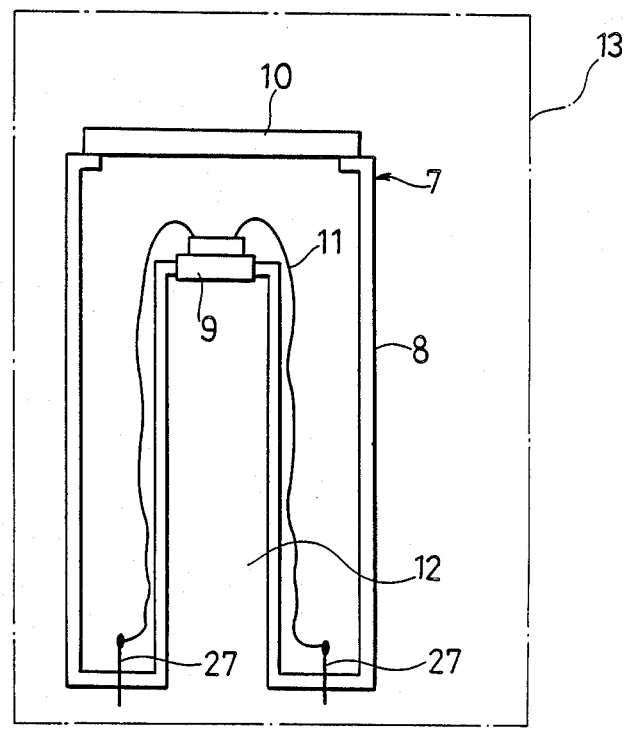
FIG. 8 is a diagram showing a structure of a prior art infrared ray detector.

In these figures, the same reference numerals designate the same elements as those shown in FIG. 6. The reference numeral 14 designates a substrate of high resistance, comprising cadmium telluride, the reference numeral 2a designates a HgCdTe crystal which is epitaxially grown on the substrate 14. The reference numeral 15 designates an infrared ray detection element comprising the substrate 14 and the HgCdTe crystal 2a. The reference numeral 16 designates a metal submount comprising e.g. a copper tungsten alloy (hereinafter referred to as "Cu-W") or fernico series alloy. The reference numeral 17 designates a hole for provisional fixation of the same to a mounting portion of a dewar, in the metal submount 16. The reference numeral 18 designates a ceramic block provided on the metal submount 16, and the reference numerals 19 designate input and output lead terminals comprising copper, provided on the ceramic blocks 18, respectively. The reference numeral 20 designates wiring for electrically connecting the electrode 3 and a lead terminal 19. The reference numeral 23 designates an internal wall of an evaluation dewar (whose entire view is not shown). The reference numeral 22 designates a screw for fixing the metal submount 16 to the evaluation dewar. The reference numeral 21 designates solder for connecting the lead wire 24 of the evaluation dewar 23 to the lead terminal 19. The reference numeral 25 designates an internal wall of the final product dewar 7.

The construction process of the infrared ray detector of this embodiment will be described.

At first, a HgCdTe crystal 2a is grown on a high resistance substrate 14 by an epitaxial growth method to a predetermined thickness thereby to produce a wafer. Next, a plurality of infrared ray detection elements are produced on the wafer by a conventional processes such as photolithography or vacuum vapor plating.

Thereafter, the wafer is divided into a plurality of chips by a dicing saw, and a plurality of infrared ray detection elements 15 each provided with the electrodes 3 and the light receiving surface 4 are obtained as in the prior art device.

Next, an infrared ray detection element 15 is soldered to a metal submount 16, Thereafter, the element is provisionally fixed onto the top surface of the internal wall 23 of the evaluation dewar comprising e.g., a, fernico series alloy 9. The side of the metal submount 16 at the side of the alloy 9 is attached to the evaluation dewar by the screw 22. The lead wire 24 of the evaluation dewar 23 and the I/O lead terminal 19 are connected with each other by solder 21.

After the evaluation of the infrared ray detection element 15 which is provisionally mounted on the evaluation dewar 23, the infrared ray detection element 15 is detached from the evaluation dewar 23, and it is soldered onto the top surface of the internal wall 25 of the final product dewar 7. Thereafter, the lead wire 11 of the final product dewar 7 and the I/O lead terminal 19 are connected with each other for example by soldering or spot welding. Thereafter, in a similar manner to that in the prior art device, the air inside of the dewar 7 is exhausted, and the infrared ray detector is completed.

In the infrared ray detector of this embodiment, the thickness of the HgCdTe crystal 2a is about 10 μm similarly to the prior art device, and the thicknesses of the substrate 14 and the metal submount 16 are both in a range of 100 to 1000 μm. In greater detail, the substrate 14 and the metal submount 16 are preferably thin to reduce the cool down time so long as no sensitivity problem. Preferably the substrate and submount are about 300 μm thick.

Furthermore, gold plating or gold vapor plating may be applied to the surface of the metal submount 16 and the surface of the substrate 14 to improve wettability by solder.

Low melting point solder of such as an indium series alloy or an bismuth series alloy is used as the solder, and the soldering is conducted at below 150° C. This is because the HgCdTe crystal 2a has limited heat resistance.

Cu-W or fernico series alloy 9 has a thermal expansion coefficient close to that of the HgCdTe crystal in order to prevent the destruction of the HgCdTe crystal 2a or deterioration in the characteristics thereof, which may arise upon cooling when there is a large difference between their thermal expansion coefficients.

The infrared ray detector 13 constructed as such can be used in a similar manner to that in the prior art device. The respective constitutional elements are adhered to each other by solder having a large thermal conductivity without using an insulating material such as an adhesive or a supporting plate which restricts the cooling speed. This enables achievement of a cool down time of several seconds.

Figure 1:
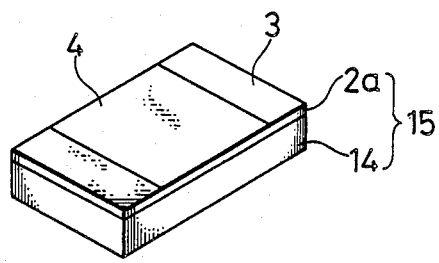
FIGS. 1 and 2 are a perspective view and a side view showing an infrared ray detection element according to an embodiment of the present invention, respectively.
Figure 2:
Figure 3:
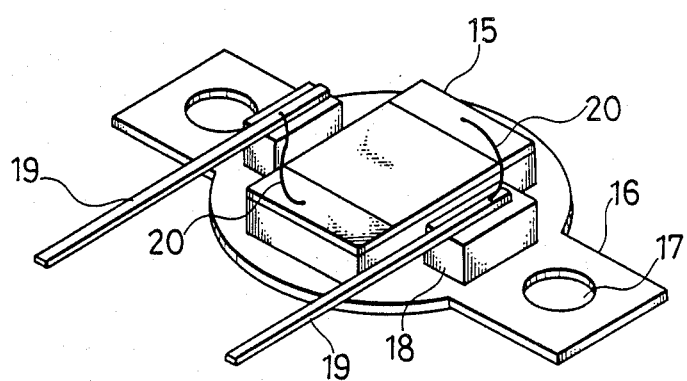
FIG. 3 is a perspective view showing an infrared ray detection element attached to a metal submount of the above-described embodiment.
Figure 4:
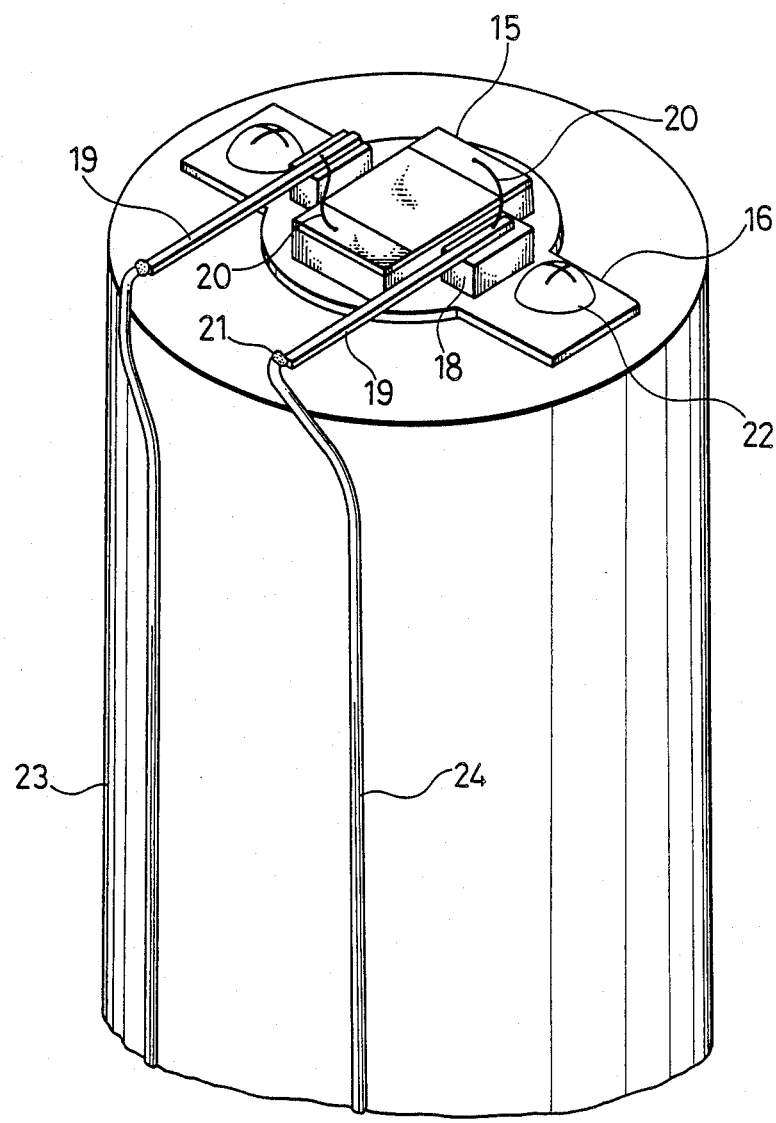
FIG. 4 is a perspective view showing a the infrared ray detection element attached to the metal submount of FIG. 3 which is provisionally mounted on an evaluation dewar.
Figure 5:
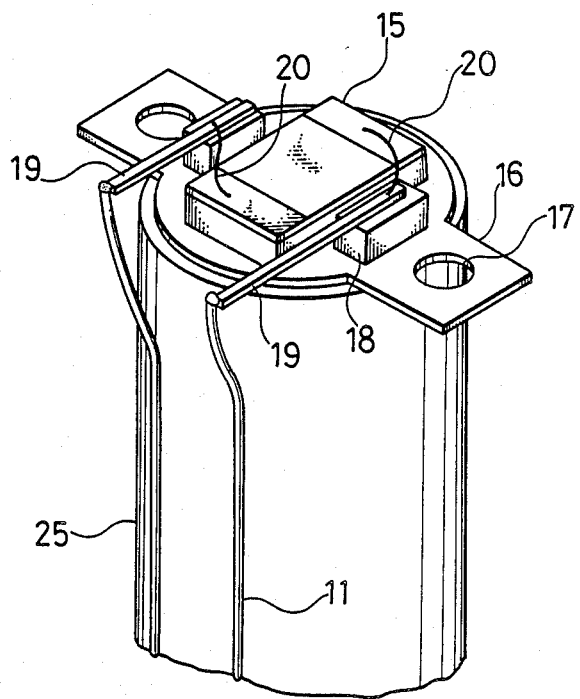
FIG. 5 is a perspective view showing the infrared ray detection element attached to the metal submount of FIG. 3 which is mounted on the final product dewar.

In the infrared ray detector of the present invention, since the infrared ray detection element 15 is supported by a metal submount 16, evaluation and selection can be easily carried out. Actually, the infrared ray detection element 15 is soldered to the metal submount 16, wiring is connected as shown in FIG. 3. Thereafter, the element 15 is provisionally fixed to an evaluation dewar by a screw utilizing the hole 17, and the air inside of the evaluation dewar is exhausted by a vacuum pump. After conducting the evaluation and selection, the infrared ray detection element 15 is taken out from the evaluation dewar, and only elements which have good characteristics are soldered to the final product dewar 7 to obtain an infrared ray detector. This enhances the work efficiency and the mass-producibility.

In the above-illustrated embodiment, HgCdTe crystal 2a is used as a semiconductor responsive to infrared rays, but the present invention may be also applied to a device using other semiconductors, e.g. InSb.

As is evident from the foregoing description, according to the present invention a plurality of infrared ray detection elements are obtained from a wafer which is produced by growing a semiconductor layer responsive to infrared rays on a high resistance substrate, an infrared ray detection element is mechanically fixed to a metal submount having I/O lead terminals, the metal submount is mechanically fixed to an adiabatic vacuum vessel for containing the infrared ray detection element and cooling the same. The infrared ray detection element and the metal submount, and the metal submount and the adiabatic vacuum vessel are respectively adhered to each other by solder. This enables reduction of the cool down time and enhances mass-producibility.

What is claimed is:

1. An infrared detector comprising:
    a semiconductor infrared ray detection element disposed on a high resistivity substrate for generating an electrical signal at a pair of electrical terminals in response to incident infrared rays; and
    a metal submount including a metal plate, two electrical lead terminals electrically insulated from each other and from said plate, said plate containing at least one hole for provisionally mounting the submount on a dewar with a fastener passing through the hole, wherein said element is soldered to said plate and the electrical terminals of said element are respectively electrically connected to the lead terminals of said submount.

2. The infrared ray detector of claim 1 wherein said lead terminals are electrically insulated from said plate by a ceramic material.

3. The infrared ray detector of claim 1 wherein said infrared ray detector element is soldered to said submount with a low melting point solder.

4. The infrared ray detector of claim 1 including a dewar and a screw passing through said hole and engaging the dewar, provisionally mounting said element on said dewar.

5. The infrared ray detector of claim claim 1 including a dewar wherein said submount is soldered to said dewar.

6. The infrared ray detector of claim 1 wherein said metal submount comprises a fernico alloy.

7. The infrared ray detector of claim 6, wherein said metal submount comprises a copper tungsten alloy.

8. The infrared ray detector of claim 1 wherein said submount contains two holes for provisionally mounting the submount on a dewar with fasteners passing through the holes.

9. The infrared ray detector of claim 3 wherein said solder is an indium alloy solder.

10. The infrared ray detector of claim 3 wherein said solder is a bismuth alloy solder.

* * * * *